(12) United States Patent
Hu et al.

(10) Patent No.: US 8,569,781 B2
(45) Date of Patent: Oct. 29, 2013

(54) LED PACKAGE WITH LIGHT-ABSORBING LAYER

(75) Inventors: Pi-Chiang Hu, Hsinchu (TW);
Shih-Yuan Hsu, Hsinchu (TW);
Kai-Lun Wang, Hsinchu (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 4 days.

(21) Appl. No.: 13/288,042

(22) Filed: Nov. 3, 2011

(65) Prior Publication Data
US 2012/0235193 A1    Sep. 20, 2012

(30) Foreign Application Priority Data

Mar. 15, 2011  (CN) .......................... 2011 1 0061860

(51) Int. Cl.
*H01L 33/00*   (2010.01)
*H01L 21/00*   (2006.01)

(52) U.S. Cl.
USPC .. 257/98; 257/99; 257/E33.06; 257/E33.062; 257/E33.072; 257/E33.075; 257/E33.059; 257/E33.061; 257/E33.068; 438/27; 438/28

(58) Field of Classification Search
None
See application file for complete search history.

(56) References Cited

U.S. PATENT DOCUMENTS

| 4,259,679 | A  | * | 3/1981 | Knibb et al. ..................... 257/98 |
| 7,531,845 | B2 | * | 5/2009 | Oshio et al. ..................... 257/98 |
| 2005/0162069 | A1 | * | 7/2005 | Ota et al. ....................... 313/501 |
| 2009/0057698 | A1 | * | 3/2009 | Okamura et al. ............... 257/98 |
| 2011/0006334 | A1 | * | 1/2011 | Ishii et al. ....................... 257/98 |

* cited by examiner

*Primary Examiner* — Julio J Maldonado
*Assistant Examiner* — Harpreet Singh
(74) *Attorney, Agent, or Firm* — Altis & Wispro Law Group, Inc.

(57) ABSTRACT

An LED package comprises a substrate, a reflector, a light-absorbing layer, an encapsulation layer and an LED chip. The light-absorbing layer is located around the reflector and is able to absorb any light which penetrates through the reflector. Therefore, any vignetting or halation of light from the LED package is prevented. Moreover, the LED package can be constructed on a very small scale with no reduction in its color rendering properties.

20 Claims, 3 Drawing Sheets

LED PACKAGE WITH LIGHT-ABSORBING LAYER

TECHNICAL FIELD

The disclosure relates generally to light emitting diode (LED) package, and more particularly to an LED package having light-absorbing structure.

DESCRIPTION OF THE RELATED ART

LEDs are popular due to low power consumption, high efficiency, quick reaction time, long life and the absence of toxic elements such as mercury. Generally, a reflector is allocated inside an LED package to increase the light intensity and render the desired color(s), wherein the reflector is made of polyphthalamide (PPA) or other thermoplastic materials. However, in reducing the size of the LED packages the reflector has become thin, such that light emitted from the LED chip may be transmitted through the reflector, leading to a reduction in the light intensity and reduced ability to render color(s). To avoid these limitations, increasing the thickness of the reflector or coating the reflector with a metallic layer are possible; nevertheless, these methods present obstacles to the reduction in size of an LED package, and the cost of manufacturing the LED packages is thereby increased. Other ways of avoiding these limitations are desirable.

DETAILED DESCRIPTION

Exemplary embodiments of the disclosure will now be described with reference to the accompanying drawings.

Figure 1:
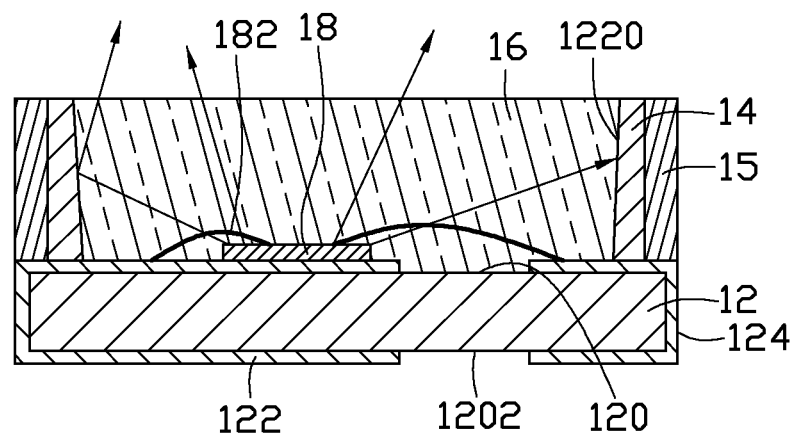
FIG. 1 is a cross section of an LED package in accordance with a first embodiment of the disclosure.

Referring to FIG. 1, the disclosure provides a first embodiment of an LED package 10, comprising a substrate 12, a reflector 14, a light-absorbing layer 15, an encapsulation layer 16 and an LED chip 18.

The substrate 12 comprises two electrodes 122, 124 located thereon, wherein the two electrodes 122, 124 comprise a cathode and an anode respectively, and the substrate 12 has a top surface 120 and a bottom surface 1202. Each of the two electrodes 122, 124 extends from the top surface 120 to the bottom surface 1202 of the substrate 12. In this embodiment, the LED chip 18 is disposed on the electrode 122 and makes electrical connection with the two electrodes 122, 124 via conductive wires 182. Thus, the LED chip 18 is able of emitting light by current from the two electrodes 122, 124.

The reflector 14 is located on the substrate 12, defining a depression 1220 located on the top surface 120, and the LED chip 18 is located inside the depression 1220. The reflector 14 is light-reflecting, made by plastic or polymer selected from PPA or epoxy resin. Alternatively, the substrate 12 and the reflector 14 can be made integrally. The light-absorbing layer 15 is located on the substrate 12 around the reflector 14, wherein the light-absorbing layer 15 has a light absorbency of over 70%. In this embodiment, the light-absorbing layer 15 is black, and made of plastic or polymer selected from PPA or epoxy resin. The encapsulation layer 16 is located inside the depression 1220, covering the LED chip 18. In this embodiment, the encapsulation layer 16 is a transparent colloid and can comprise one luminescent conversion element (not shown).

Light emitted from the LED chip 18 is reflected by the reflector 14 in a certain predetermined direction so as to enhance the light intensity of the LED package 10. Even though the reflector 14 is physically thin, so that some light escapes through the reflector 14, the presence of the light-absorbing layer 15 around the reflector 14 reduces the effects of this escape of emitted light. Thus, the color rendering property of the LED package 10 is maintained, substantially without vignetting or halation during operation.

Figure 2:
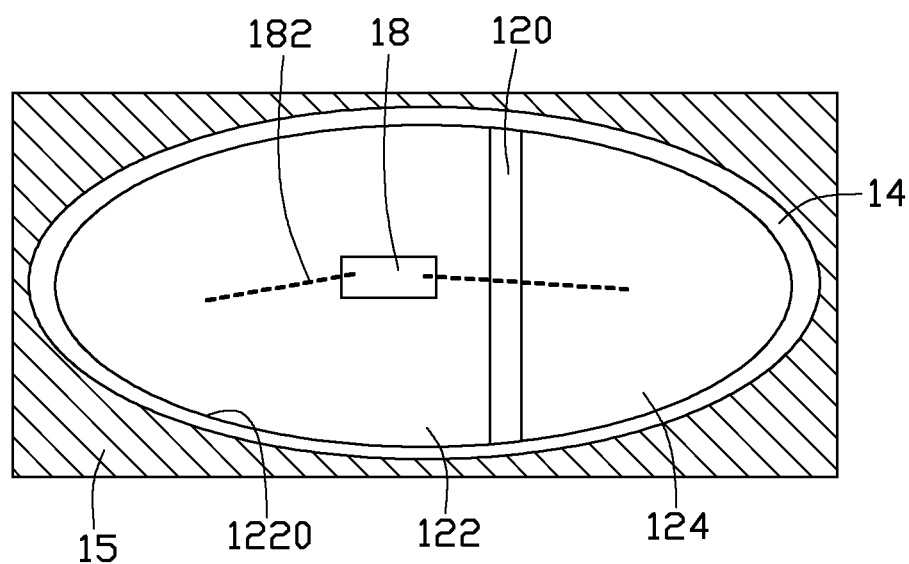
FIG. 2 is a top view showing a reflector and a light-absorbing layer of the LED package in accordance with FIG. 1.

The reflector 14 and the light-absorbing layer 15 are formed separately by separately modeling, as shown in FIG. 2. After the reflector 14 is placed on the top surface 120 by a molding process, the light-absorbing layer 15 is formed to surround the reflector 14 by another molding process. However, these molding processes can be insert molding, injection molding or transfer molding all of which are low cost and easy to incorporate into a mass production system.

Figure 3:
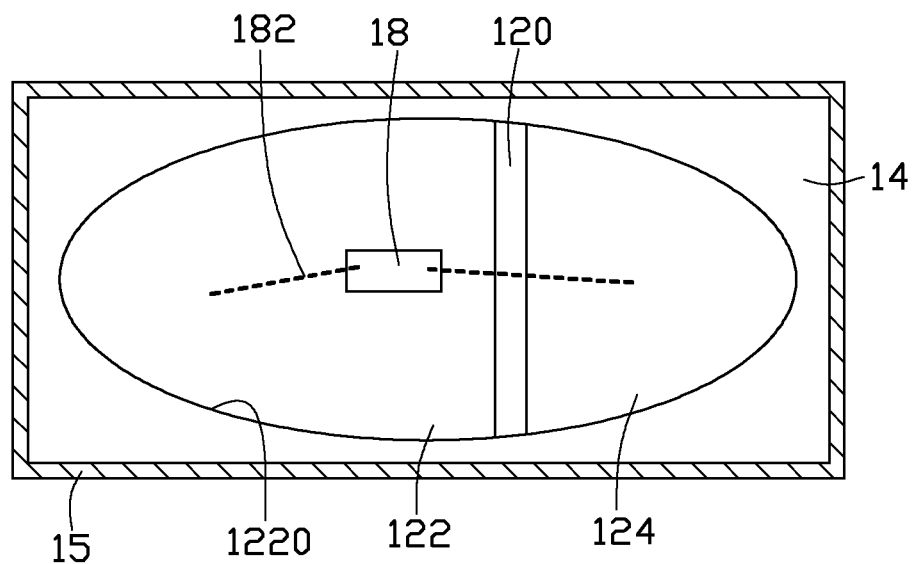
FIG. 3 is a top view showing an LED package in accordance with a second embodiment of the disclosure.

A second embodiment of the LED package 10, as shown in FIG. 3, is similar to the first embodiment with a difference therebetween only in that the light-absorbing layer 15 of the second embodiment is provided by bonding or coating. In the second embodiment, the light-absorbing layer 15 can be made very thin, in the form of a tape, a paste or a thin film, and the simultaneous bonding or coating around the reflector 14 may result in an even smaller size of the LED package 10.

Accordingly, in this disclosure, the LED package 10 provides a light-absorbing layer 15 around the reflector 14. The light-absorbing layer 15 is able to absorb the emitted light which may penetrate through a thin reflector 14. Therefore, the vignetting or halation of light from the LED package 10 is prevented. Moreover, the LED package 10 can be constructed on a very small scale with no reduction in the ability to render color.

It is to be understood, however, that even though numerous characteristics and advantages of the disclosure have been set forth in the foregoing description, together with details of the structure and function of the disclosure, the disclosure is illustrative only, and changes may be made in detail, especially in the matters of shape, size, and arrangement of parts within the principles of the disclosure to the full extent indicated by the broad general meaning of the terms in which the appended claims are expressed.

What is claimed is:

1. An LED package, comprising:
a substrate, having two electrodes located thereon;
an LED chip, disposed on the substrate and, respectively, electrically connecting to the two electrodes;
a reflector, defining a depression located on the substrate, wherein the LED chip is disposed inside the depression;
a light-absorbing layer, located on the substrate around the reflector, the light-absorbing layer being a paste; and
an encapsulation layer, located inside the depression, covering the LED chip.

2. The LED package as claimed in claim 1, wherein the two electrodes comprise a cathode and an anode respectively extending from a top surface of the substrate to an opposite bottom surface.

3. The LED package as claimed in claim 2, wherein the depression is located on the top surface of the substrate.

4. The LED package as claimed in claim 1, wherein the LED chip electrically connects to the two electrodes via conductive wires.

5. The LED package as claimed in claim 1, wherein the reflector is light-reflective made by plastic or polymer selected from polyphthalamide (PPA) or epoxy resin.

6. The LED package as claimed in claim 1, wherein the light-absorbing layer is light-absorbing made by plastic or polymer selected from PPA or epoxy resin.

7. The LED package as claimed in claim 6, wherein the light-absorbing layer is black with a light absorbance over 70%.

8. The LED package as claimed in claim 1, wherein the encapsulation layer is a transparent colloid comprising one luminescent conversion element.

9. The LED package as claimed in claim 1, wherein the reflector and the light-absorbing layer are formed separately by twice molding.

10. The LED package as claimed in claim 1, wherein the reflector is formed by molding and the light-absorbing layer is made by coating or bonding.

11. An LED package, comprising:
a substrate, having a reflector defining a depression and two electrodes located on a top surface of the substrate;
an LED chip, disposed inside the depression and, respectively, electrically connecting to the two electrodes;
a light-absorbing layer, located on the substrate around the reflector, the light-absorbing layer being a paste; and
an encapsulation layer, located inside the depression, covering the LED chip.

12. The LED package as claimed in claim 11, wherein the two electrodes comprise a cathode and an anode respectively extending from the top surface to an opposite bottom surface of the substrate.

13. The LED package as claimed in claim 11, wherein the substrate and the reflector are integrated.

14. The LED package as claimed in claim 13, wherein the substrate and the reflector are formed by molding.

15. The LED package as claimed in claim 11, wherein the LED chip electrically connects to the two electrodes via conductive wires.

16. The LED package as claimed in claim 11, wherein the reflector is light-reflective made by plastic or polymer selected from PPA or epoxy resin.

17. The LED package as claimed in claim 11, wherein the light-absorbing layer is light-absorbing made by plastic or polymer selected from PPA or epoxy resin.

18. The LED package as claimed in claim 17, wherein the light-absorbing layer is black with a light absorbance over 70%.

19. The LED package as claimed in claim 11, wherein the encapsulation layer is a transparent colloid comprising one luminescent conversion element.

20. The LED package as claimed in claim 11, wherein the light-absorbing layer is made by molding, coating or bonding.

* * * * *